(12) United States Patent
Lin et al.

(10) Patent No.: US 8,004,437 B2
(45) Date of Patent: Aug. 23, 2011

(54) BANDPASS DELTA-SIGMA MODULATOR

(75) Inventors: Tsung-Hsien Lin, Taipei (TW); Yu-Yu Chen, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 12/632,793

(22) Filed: Dec. 7, 2009

(65) Prior Publication Data

US 2011/0133969 A1 Jun. 9, 2011

(51) Int. Cl.
*H03M 3/00* (2006.01)
(52) U.S. Cl. .......................... 341/143; 341/155
(58) Field of Classification Search .................. 341/143, 341/155, 159, 120; 375/244
See application file for complete search history.

(56) References Cited

U.S. PATENT DOCUMENTS

| 5,442,353 A | * | 8/1995 | Jackson ..................... 341/143 |
| 6,864,818 B1 | * | 3/2005 | Hezar ......................... 341/143 |
| 2005/0068213 A1 | * | 3/2005 | Fontaine et al. ............ 341/143 |

OTHER PUBLICATIONS

Y. Chen, "Bandpass Delta-Sigma Modulator with a Digitally-Assisted Loop Filter," Sep. 2009.

* cited by examiner

*Primary Examiner* — Joseph Lauture
(74) *Attorney, Agent, or Firm* — Stout, Uxa, Buyan & Mullins, LLP

(57) ABSTRACT

A bandpass delta-sigma modulator is formed to include a bandpass filtering circuit that bandpass filters an input signal. An analog-to-digital converter (ADC) receives output of the bandpass filtering circuit and generates an output quantization code. A digital filter receives the output quantization code. A digital-to-analog converter (DAC) receives output of the digital filter and scales the value of the output quantization code by DAC coefficients to the bandpass filtering circuit.

16 Claims, 6 Drawing Sheets

$$dac_{NRZ}(t) = \begin{cases} 1, & 0 \leq t \leq T_s \\ 0, & \text{otherwise} \end{cases}$$

$$DAC_{NRZ}(s) = \frac{1-e^{-sT_s}}{s}$$

$$dac_{RZ}(t) = \begin{cases} 1, & 0 \leq t \leq 0.5T_s \\ 0, & \text{otherwise} \end{cases}$$

$$DAC_{RZ}(s) = \frac{1-e^{-sT_s/2}}{s}$$

$$dac_{HRZ}(t) = \begin{cases} 1, & 0.5T_s \leq t \leq T_s \\ 0, & \text{otherwise} \end{cases}$$

$$DAC_{HRZ}(s) = \frac{e^{-sT_s/2}(1-e^{-sT_s/2})}{s}$$

US 8,004,437 B2

BANDPASS DELTA-SIGMA MODULATOR

BACKGROUND OF THE INVENTION

1. Field of the Invention

The present invention generally relates to a delta-sigma modulator, and more particularly to a continuous-time (CT) radio-frequency (RF) bandpass delta-sigma modulator.

2. Description of Related Art

A delta-sigma ($\Delta\Sigma$) modulator or sigma-delta ($\Sigma\Delta$) modulator is a feedback system that employs simple circuit blocks to achieve high-resolution output signals. The delta-sigma modulator is widely adapted to electronic circuits such as analog-to-digital converters (ADCs), digital-to-analog converters (DACs) or frequency synthesizers, and is highly attractive in wireless communications due to its simplicity and low-power consumption. The radio-frequency (RF) bandpass delta-sigma modulator is one type of delta-sigma modulator that is well adaptable, for example, to RF signal reception and subsequent digitization without frequency down-conversion.

FIG. 1A shows a block diagram of a conventional continuous-time RF bandpass delta-sigma modulator. FIG. 1B shows an equivalent mathematical model of the block diagram of FIG. 1A. With respect to the circuit implementation of the bandpass filter 10, an LC bandpass filter provides better linearity and low-power consumption as compared to an active-RC resonator mainly for the reason that an operational amplifier of the active-RC resonator is unrealizable under high frequency. However, the delta-sigma modulator using the LC bandpass filter causes a second-order function itself with only one input node. This therefore causes a problem of insufficient control variables.

In order to resolve the insufficient-control-variable problem, a multi-feedback DAC is adopted such that at the same input and output node two different DACs 20 and 22 are used, as shown in FIG. 2, instead of using the single DAC 12 as shown in FIG. 1A. Specifically, the two DACs of different DAC type are utilized to generate different path equations in order to overcome the insufficient control variables at each feedback point. FIG. 3 shows three different types of DACs, that is, a non-return-to-zero (NRZ) DAC, return-to-zero (RZ) DAC and half-return-to-zero (HRZ) DAC, which are commonly used in bandpass delta-sigma modulators. The DAC feedback impulse response dac(t) and the corresponding Laplace transform DAC(s) are both shown in the figure. It can be observed in the figure that the NRZ DAC pulse has only one transition in one sampling period, while the RZ DAC and the HRZ DAC pulses have two transitions in one sampling period.

Nevertheless, adoption of the multi-feedback DAC can cause a relatively serious problem of clock-jitter (e.g., clock-jitter effect). Clock-jitter affects the falling/rising times of the feedback DACs 20 and 22 (FIG. 2), and will degrade the performance of the modulator.

For the reason that the conventional bandpass delta-sigma modulator cannot effectively solve both problems of insufficient control variables and the clock-jitter effect, a need has arisen to propose a novel bandpass delta-sigma modulator in order to overcome the aforementioned problems.

SUMMARY OF THE INVENTION

In view of the foregoing, it is an object of the embodiment of the present invention to provide a radio-frequency (RF) bandpass delta-sigma modulator with a digitally-assisted filter and a single digital-to-analog converter (DAC) feedback path. Compared to conventional bandpass delta-sigma modulators, the proposed embodiment uses fewer feedback DAC units and has better signal-to-noise ratio (SNR).

According to one embodiment, the bandpass delta-sigma modulator primarily includes a bandpass filtering circuit, an analog-to-digital converter (ADC), a digital lowpass filter (LPF) and a non-return-to-zero (NRZ) digital-to-analog converter (DAC). The bandpass filtering circuit bandpass filters an input signal. The ADC receives an output of the bandpass filtering circuit and generates an output quantization code. The digital LPF lowpasses the output quantization code. The NRZ DAC receives an output of the digital LPF and scales the value of the output quantization code by DAC coefficients to the bandpass filtering circuit.

DETAILED DESCRIPTION OF THE INVENTION

Figure 4:
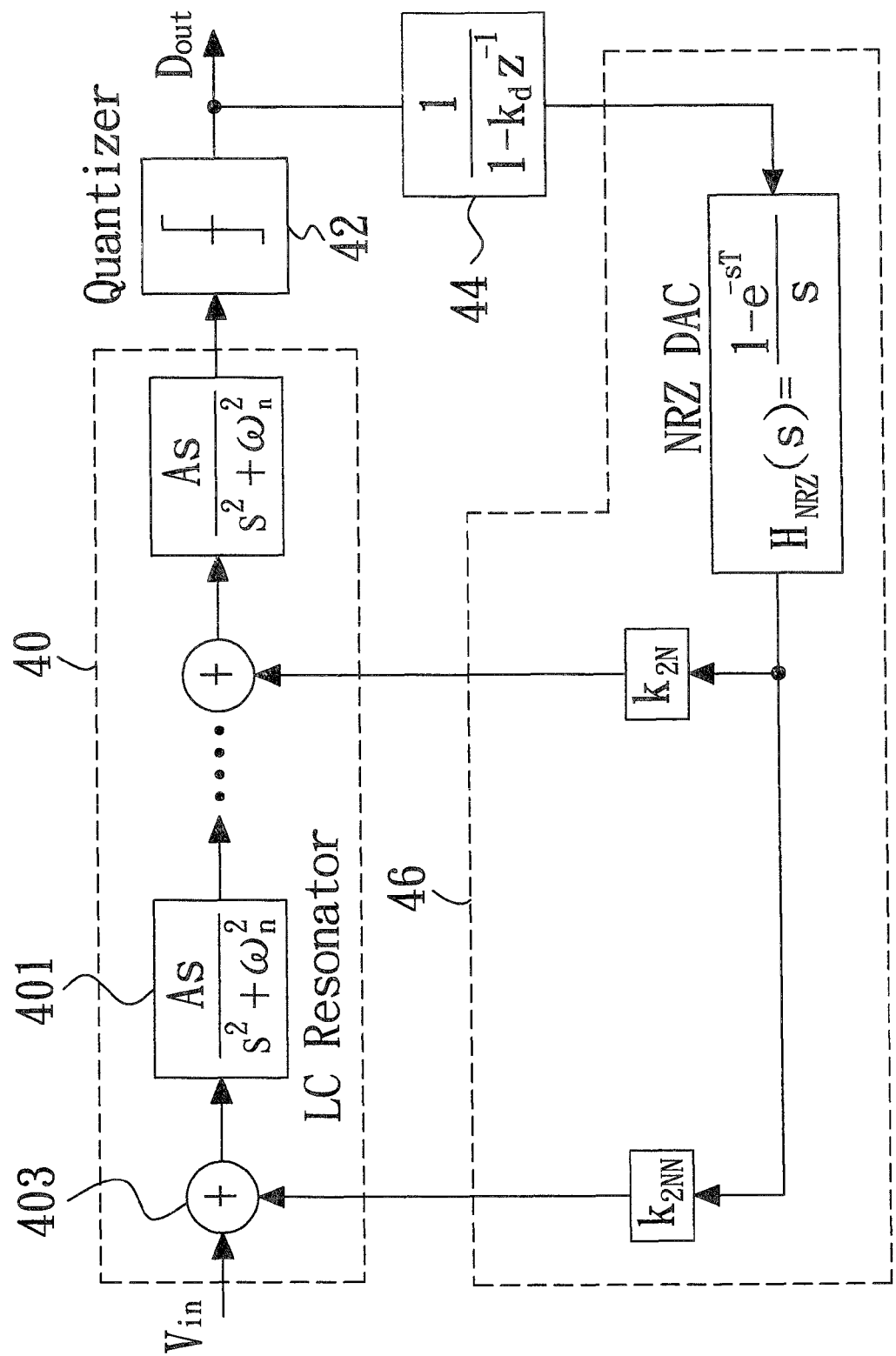
FIG. 4 is a block diagram that illustrates a radio-frequency (RF) bandpass delta-sigma modulator according to one embodiment of the present invention, as well as the equivalent mathematical model of the block diagram.

FIG. 4 is a block diagram that illustrates a radio-frequency (RF) bandpass delta-sigma ($\Delta\Sigma$) modulator according to one embodiment of the present invention, as well as the equivalent mathematical model of the block diagram. Some analysis of the mathematical model is discussed in a disclosure entitled "Bandpass Delta-Sigma Modulator with a Digitally-Assisted Loop Filter," by Yu-Yu Chen, one of the inventors of the present application, the disclosure of which is hereby incorporated by reference.

In the embodiment, the delta-sigma modulator includes a bandpass filtering circuit 40 and an analog-to-digital converter (ADC) or quantizer 42 in the feedforward path, and includes a digitally-assisted filter 44 and a digital-to-analog converter (DAC) 46 in the feedback path. In the embodiment, the digitally-assisted filter 44 may be a digital filter, such as a digital lowpass filter (LPF).

Figure 3:
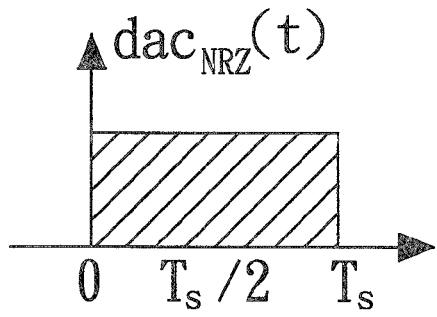
FIG. 3 shows three different types of DACs.
Figure 3:
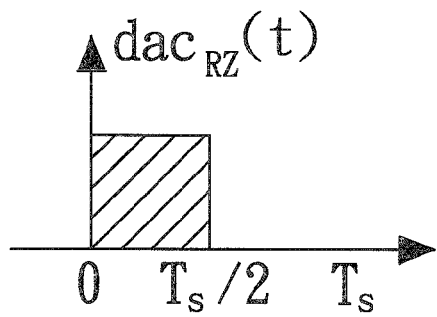
Figure 3:
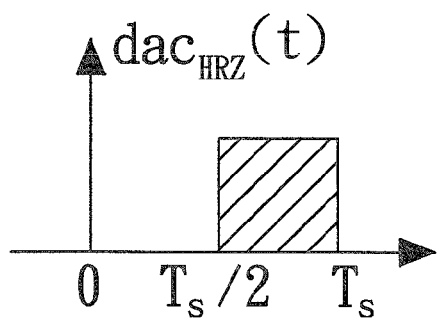

Specifically, the bandpass filtering circuit 40 can be made of a number of series-connected bandpass filters 401. Each bandpass filter 401 may be, but is not limited to, an LC (inductor-capacitor) resonator. In general, a 2n-th order delta-sigma modulator has n bandpass filters 401. Every two neighboring bandpass filters 401 is inserted with an adder 403. The adder 403 adds the output of a preceding bandpass filter 401 (or adds an (analog) input signal Vin if the adder 403 is the first one), subtracts the output of the DAC 46, and then outputs the difference to a succeeding bandpass filter 401. The ADC (e.g., a quantizer) 42 receives the output of the bandpass filtering circuit 40, and then outputs its resultant (digital) output quantization code $D_{out}$. The LPF 44 receives the output quantization code $D_{out}$ and feeds its output to the DAC 46. The DAC 46 provides coefficients $k_{2N/N}$, $k_{2(N-1)/N}$ … $k_{2/N}$ to the n adders 403 of the bandpass filtering circuit 40 respectively in order to scale the value of the output quantization code. Compared to the conventional delta-sigma modulator such as that shown in FIG. 3, the present embodiment illustrated in FIG. 4 uses only half DAC units.

In a preferred embodiment, the DAC 46 is, but is not limited to, a non-return-to-zero (NRZ) DAC. The rationale for using the NRZ DAC, in this embodiment, over other types of DAC, e.g., the RZ DAC or HRZ DAC (FIG. 3) is that the NRZ DAC pulse has only one transition in one sampling period compared to two transitions in other types of DAC. With consideration to the clock-jitter, fewer transitions result in better performance. The transfer function of the NRZ DAC may be expressed as $$H_{NRZ}(s) = \frac{1 - e^{-sT}}{s}$$

where T is a period.

In the embodiment, the transfer function of the digital LPF 44 may be expressed as $$H_{DLP}(z) = \frac{1}{1 - k_d z^{-1}}$$

where $k_d$ is a predefined constant.

Figure 1A:
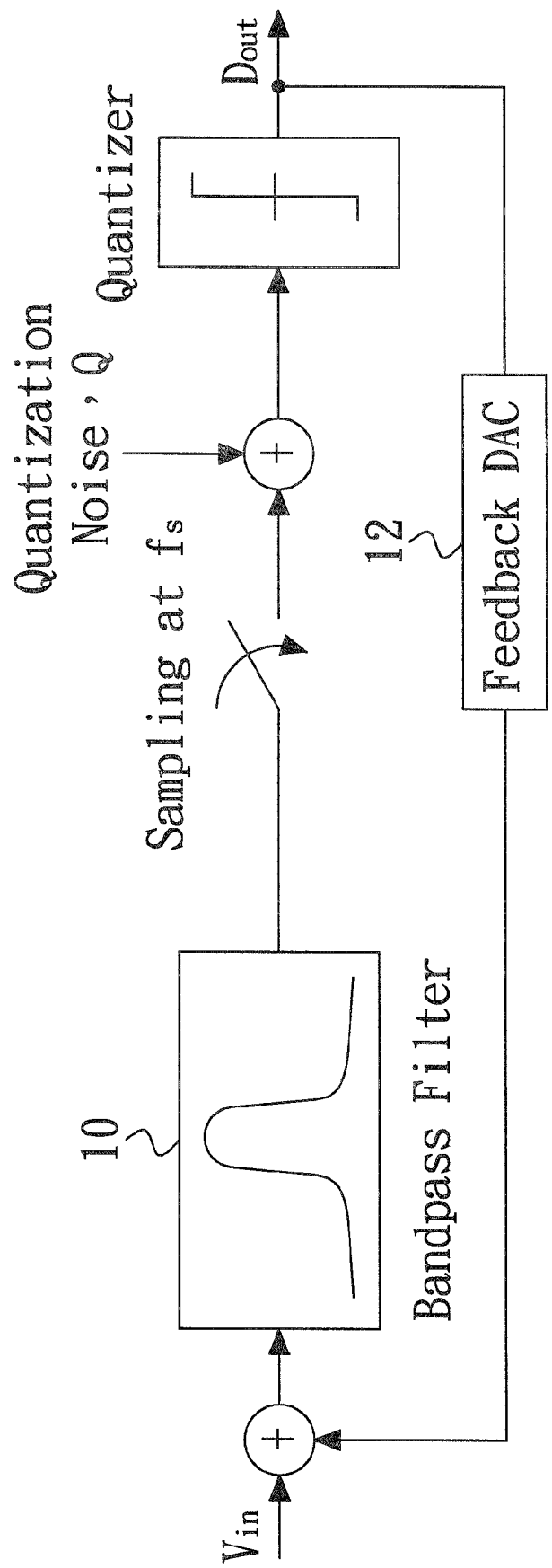
FIG. 1A shows a block diagram of a conventional continuous-time radio frequency (RF) bandpass delta-sigma modulator.
Figure 1B:
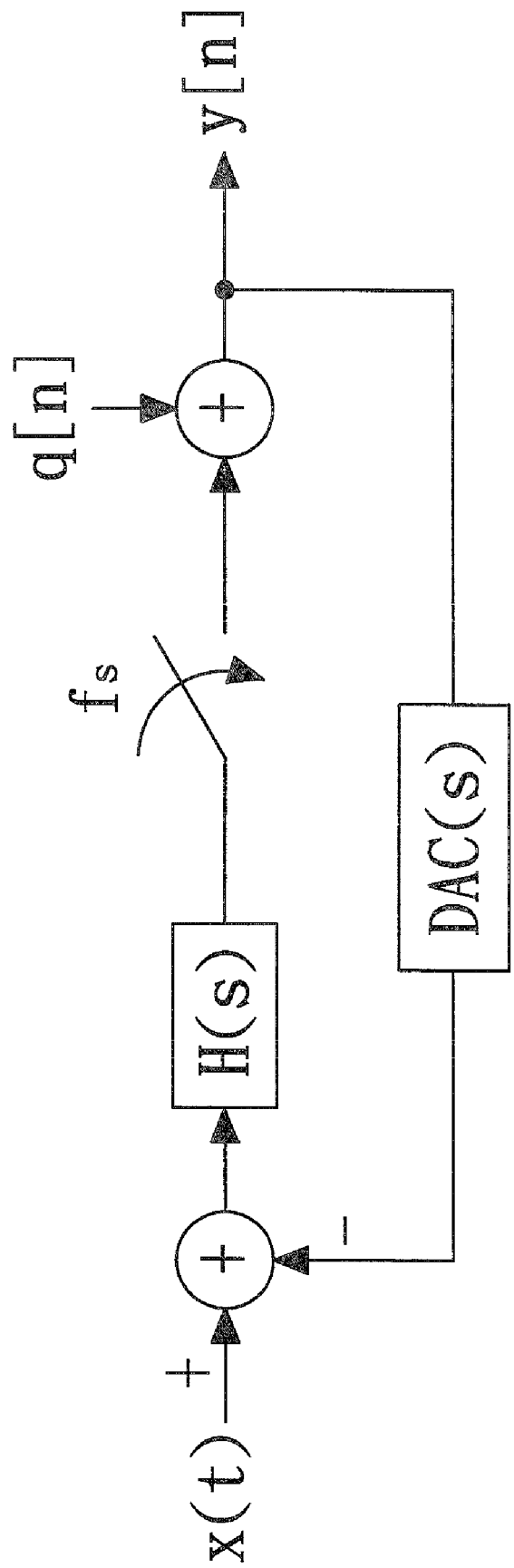
FIG. 1B shows an equivalent mathematical model of the block diagram of FIG. 1A.
Figure 2:
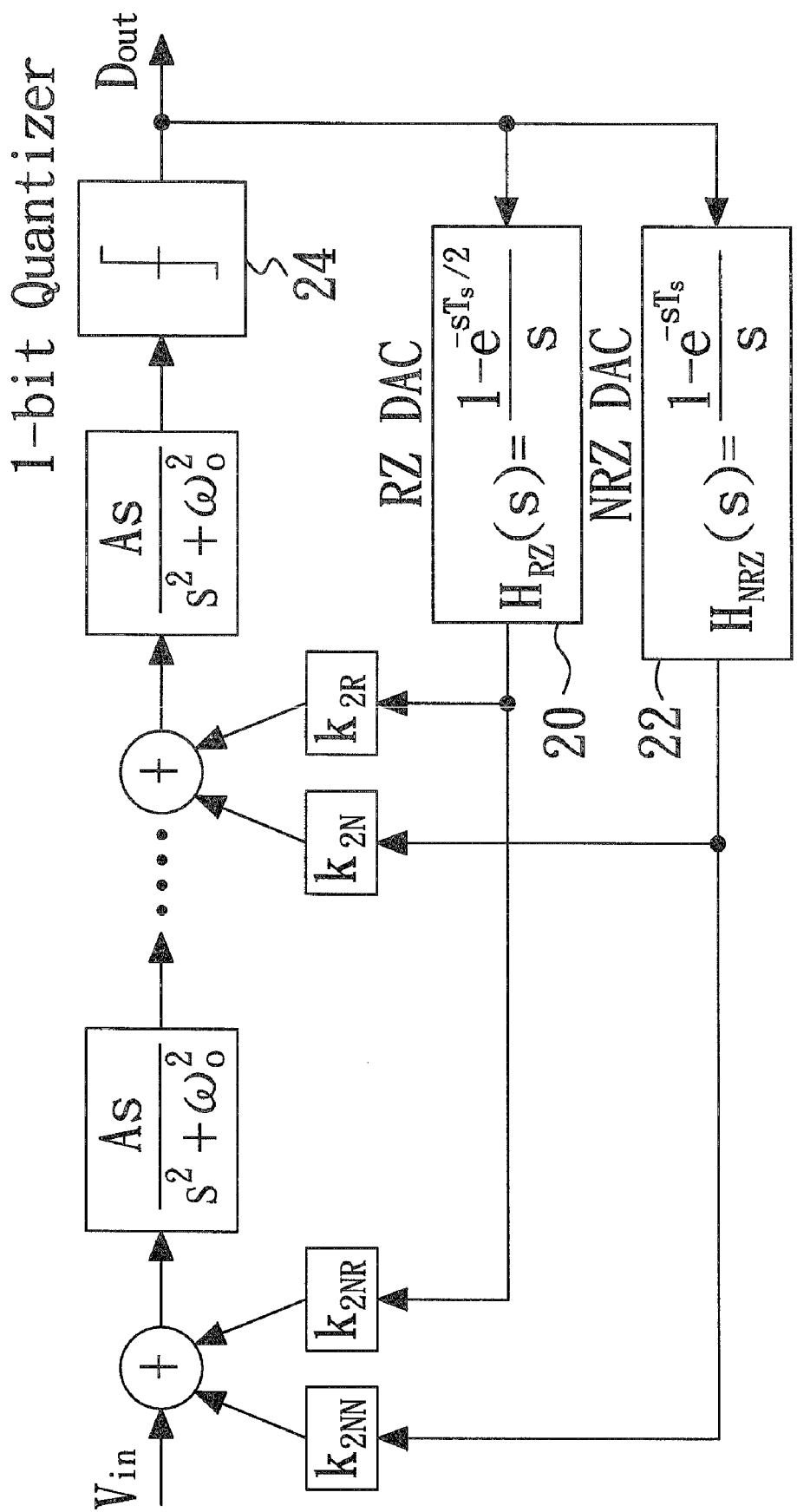
FIG. 2 shows a mathematical model of a conventional bandpass delta-sigma modulator using two different DACs.

According to mathematical analysis, when the value of $k_d$ is equal to 1, the performance of the delta-sigma modulator of FIG. 4 may be comparable to that of a conventional delta-sigma modulator such as that shown in FIG. 2. In practice, it is infeasible to design a real digital LPF 44 with $k_d$=1. Accordingly, it is preferable and acceptable to design a digital LPF 44, for example, with $k_d$<1, for example $k_d$=0.4, which does not affect the loop gain at the frequency range of interest.

In the embodiment, the time-domain representation of the digital LPF 44 may be expressed as: y[n]=Q{x[n]+$k_d$*y[n−1]} where Q{ } represents a quantize-like behavior, y[n−1] is the previous LPF's output, y[n] is the present LPF's output, and x[n] is the present output of the ADC 42.

Table 1 shows an exemplary signal value flow of the digital LPF 44. A finite-state machine (FSM) may be adapted to simplify the implementation of the digital LPF.

TABLE 1

| Current value y[n] | Next value y[n − 1], while x[n] = 1 | Next value y[n − 1], while x[n] = −1 |
|---|---|---|
| 1.5 | Q{1.6} = 1.5 | Q{−0.4} = −0.5 |
| 1 | Q{1.4} = 1.5 | Q{−0.6} = −0.5 |
| 0.5 | Q{1.2} = 1 | Q{−0.8} = −1 |
| −0.5 | Q{0.8} = 1 | Q{−1.2} = −1 |
| −1 | Q{0.6} = 0.5 | Q{−1.4} = −1.5 |
| −1.5 | Q{0.4} = 0.5 | Q{−1.6} = −1.5 |

Figure 5:
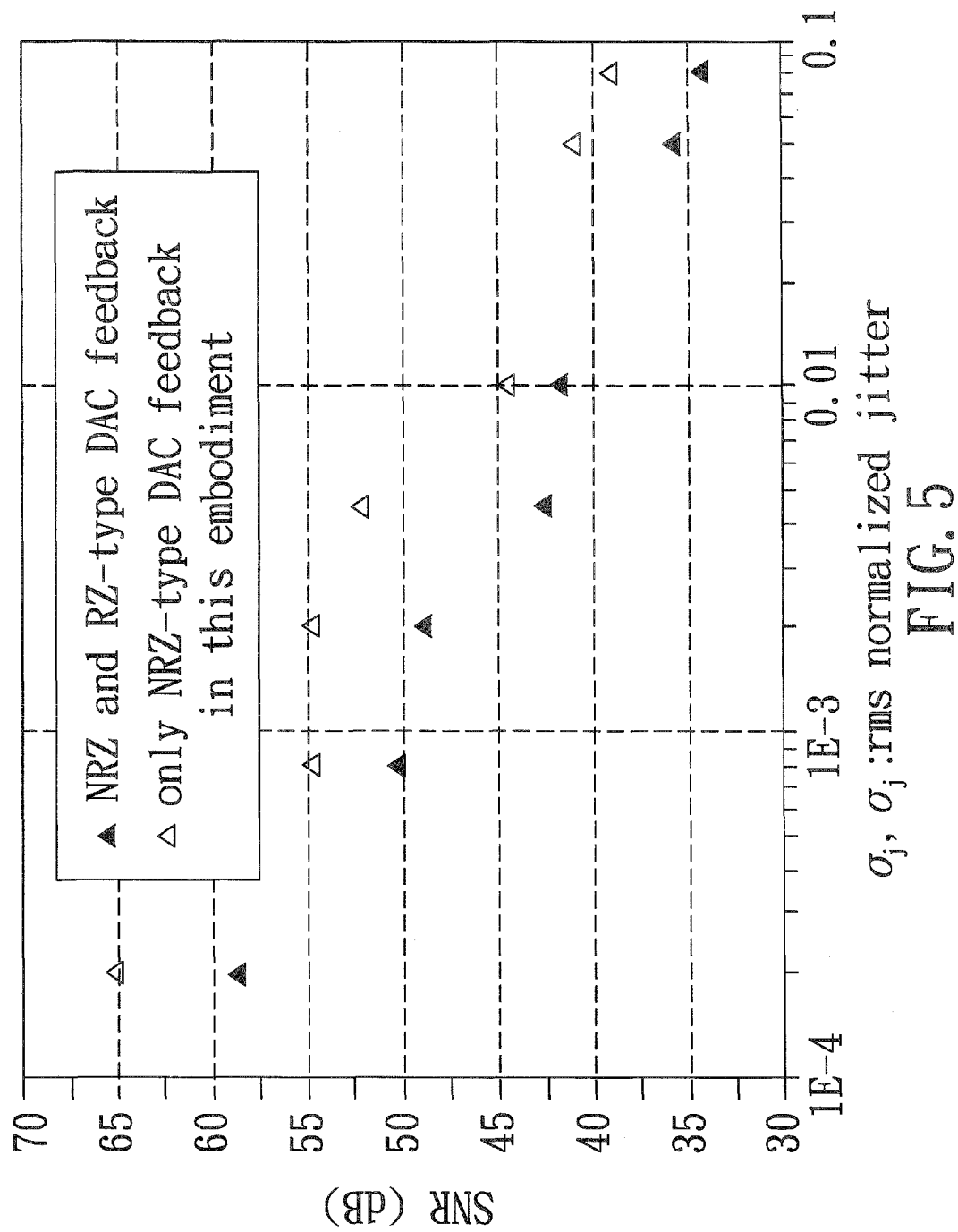
FIG. 5 shows the signal-to-noise ratio (SNR) versus normalized root-mean-square (rms) jitter between the conventional delta-sigma modulator with NRZ DAC and RZ DAC and the present embodiment with only NRZ DAC.

According to the embodiment described above, the present embodiment may substantially reduce the sensitivity to clock-jitter. FIG. 5 shows the signal-to-noise ratio (SNR) versus normalized root-mean-square (rms) jitter between the conventional delta-sigma modulator with NRZ DAC and RZ DAC and the present embodiment with only NRZ DAC. It can be observed that about a 5 dB increase of SNR may be attained.

Although specific embodiments have been illustrated and described, it will be appreciated by those skilled in the art that various modifications may be made without departing from the scope of the present invention, which is intended to be limited solely by the appended claims.

What is claimed is:

1. A bandpass delta-sigma modulator, comprising:
a bandpass filtering circuit configured to bandpass filter an input signal;
an analog-to-digital converter (ADC) coupled to receive output of the bandpass filtering circuit and generate an output quantization code;
a digital filter coupled to receive the output quantization code; and
a digital-to-analog converter (DAC) coupled to receive an output of the digital filter and scale a value of the output quantization code by DAC coefficients to the bandpass filtering circuit, wherein the digital filter comprises a transfer function H(z) in z-domain according to $$H(z) = \frac{1}{1 - k_d z^{-1}}$$

with $k_d$ being a predefined constant.

2. The modulator of claim 1, wherein the ADC comprises a quantizer.

3. The modulator of claim 1, wherein the digital filter comprises a digital lowpass filter (LPF).

4. The modulator of claim 3, wherein the digital LPF has a transfer function $H_{DLP}$ in z-domain expressed as $$H_{DLP}(z) = \frac{1}{1 - k_d z^{-1}}$$

where $k_d$ is a predefined constant.

5. The modulator of claim 4, wherein the predefined constant $k_d$ has a value less than 1.

6. The modulator of claim 3, wherein a time-domain representation of the digital LPF is expressed as y[n]=Q{x[n]+$k_d$*y[n−1]} where Q{ } represents a quantize-like behavior, y[n−1] is a previous output of the digital LPF, y[n] is a present output of the digital LPF, and x[n] is a present output of the ADC.

7. The modulator of claim 1, wherein the DAC comprises a non-return-to-zero (NRZ) DAC.

8. The modulator of claim 7, wherein the NRZ DAC has a transfer function $H_{NRZ}$ in s-domain expressed as $$H_{NRZ}(s) = \frac{1 - e^{-sT}}{s}$$

where T is a period.

9. The modulator of claim 1, wherein each of the bandpass filters comprises an LC resonator.

10. A bandpass delta-sigma modulator, comprising:
a bandpass filtering circuit configured to bandpass filter an input signal;
an analog-to-digital converter (ADC) coupled to receive an output of the bandpass filtering circuit and generate an output quantization code;
a digital lowpass filter (LPF) configured to lowpass the output quantization code; and
a non-return-to-zero (NRZ) digital-to-analog converter (DAC) coupled to receive an output of the digital LPF and scale a value of the output quantization code by DAC coefficients to the bandpass filtering circuit;

wherein the digital LPF has a transfer function $H_{DLP}$ in z-domain expressed as $$H_{DLP}(z) = \frac{1}{1-k_d z^{-1}}$$

with $k_d$ being a predefined constant.

11. The modulator of claim 10, wherein the ADC comprises a quantizer.

12. The modulator of claim 10, wherein the predefined constant $k_d$ has a value less than 1.

13. The modulator of claim 10, wherein a time-domain representation of the digital LPF is expressed as $$y[n]=Q\{x[n]+k_d*y[n-1]\}$$

where Q{ } represents a quantize-like behavior, y[n−1] is a previous output of the digital LET, y[n] is a present output of the digital LPF, and x[n] is a present output of the ADC.

14. The modulator of claim 10, wherein the NRZ DAC has a transfer function $H_{NRZ}$ in s-domain expressed as $$H_{NRZ}(s) = \frac{1-e^{-sT}}{s}$$

where T is a period.

15. The modulator of claim 10, wherein the bandpass filtering circuit comprises:

a plurality of series-connected bandpass filters; and a plurality of adders, wherein every two neighboring bandpass filters is inserted with one of the adders, with each of the bandpass filters being preceded by one of the adders;

wherein the adder adds output of the preceding bandpass filter or adds the input signal if the adder is the first one, the adder further subtracts output of the NRZ DAC, and the adder then outputs a difference to the succeeding bandpass filter.

16. The modulator of claim 15, wherein each of the bandpass filters comprises an LC resonator.

* * * * *